United States Patent
Hwang et al.

(10) Patent No.: US 8,822,267 B2
(45) Date of Patent: Sep. 2, 2014

(54) SYSTEM IN PACKAGE MANUFACTURING METHOD USING WAFER-TO-WAFER BONDING

(71) Applicant: STMicroelectronics Pte Ltd., Singapore (SG)

(72) Inventors: How Yuan Hwang, Sitiawan (MY); Jay Maghirang, Singapore (SG); Yaohuang Huang, Singapore (SG); Kim-Yong Goh, Singapore (SG); Phone Maw Hla, Singapore (SG); Edmond Soon, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 0 days.

(21) Appl. No.: 13/655,036

(22) Filed: Oct. 18, 2012

(65) Prior Publication Data

US 2014/0113410 A1 Apr. 24, 2014

(51) Int. Cl.
 *H01L 21/00* (2006.01)
(52) U.S. Cl.
 USPC .......................................................... 438/107

(58) Field of Classification Search
 USPC ............... 438/106–103, 113; 257/E777, 778, 257/E21.503, E21.511
 See application file for complete search history.

(56) References Cited

U.S. PATENT DOCUMENTS

| | | | |
|---|---|---|---|
| 2006/0284299 A1* | 12/2006 | Karnezos | 257/686 |
| 2010/0078789 A1* | 4/2010 | Choi et al. | 257/686 |

* cited by examiner

*Primary Examiner* — Brook Kebede
(74) *Attorney, Agent, or Firm* — Seed IP Law Group PLLC

(57) ABSTRACT

Embodiments of the present disclosure are related to manufacturing system-in-packages at wafer-level. In particular, various embodiments are directed to adhering a first wafer to a second wafer and adhering solder balls to contact pads of the first wafer. In one embodiment, a first wafer having first and second surfaces is provided. The first wafer includes bond pads located on the first surface that are coupled to a respective semiconductor device located in the first wafer. A second wafer having an electrical component located therein is provided. A conductive adhesive is provided on at least one of the first wafer and the second wafer. Conductive balls are provided on the bond pads on the first surface of the first wafer. The conductive balls and the conductive adhesive are heated to cause the conductive balls to adhere to the bond pad and the conductive adhesive to adhere the first wafer to the second wafer.

20 Claims, 7 Drawing Sheets

SYSTEM IN PACKAGE MANUFACTURING METHOD USING WAFER-TO-WAFER BONDING

BACKGROUND

1. Technical Field

Embodiments of the present disclosure are related to manufacturing processes of semiconductor packages, and in particular, to wafer-to-wafer bonding to form a wafer-level system-in-package.

2. Description of the Related Art

There is continuing market pressure to increase the density and reduce the size of the semiconductor devices and packages. Responses to this pressure include the development of chip-scale packaging and wafer-level packaging. Chip-scale packages have a footprint that is very close to the actual area of the semiconductor die and are generally direct surface mountable using flip chip configurations and the like. Wafer-level packages are packages in which some portion of the "back-end" processing is performed on all of the chips at wafer-level, before the wafer is singulated.

Another development of wafer-level packing is the reconstituted wafer, also referred to as a reconfigured wafer, in which a semiconductor wafer is separated into individual dice, which are reformed into a reconstituted wafer to allow for further processing at wafer-level. The dice on the reconstituted wafer are spaced some greater distance apart than on the original wafer and are embedded in a layer of molding compound. One benefit is that this provides increased area for each die for back end processes, such as the formation of contacts at a scale or pitch that is compatible with circuit board limitations, without sacrificing valuable real estate on the original wafer. Some packages of this type are known as fan-out wafer-level packages, because the contact positions of the original die are "fanned out" to a larger foot print.

System-in-package (SiP) is a type of semiconductor package in which multiple devices are enclosed within a package. In some cases, a system-in-package includes one or more devices attached to a back side surface of a first device. Conductive paths, such as through-mold vias, are provided to enable electrical connection of the one or more devices on the back surface of the first device to a front surface of the package. The entire assembly may then be encapsulated.

BRIEF SUMMARY

Embodiments of the present disclosure are related to manufacturing system-in-packages at wafer-level. In particular, various embodiments are directed to adhering a first wafer to a second wafer and adhering solder balls to contact pads of the first wafer. In one embodiment, a first wafer having first and second surfaces is provided. The first wafer includes bond pads located on the first surface that are coupled to a respective semiconductor device located in the first wafer. A second wafer having an electrical component located therein is provided. A conductive adhesive is provided on at least one of the first wafer and the second wafer. Conductive balls are provided on the bond pads on the first surface of the first wafer. The conductive balls and the conductive adhesive are heated to cause the conductive balls to adhere to the bond pad and the conductive adhesive to adhere the first wafer to the second wafer.

DETAILED DESCRIPTION

Figure 1:
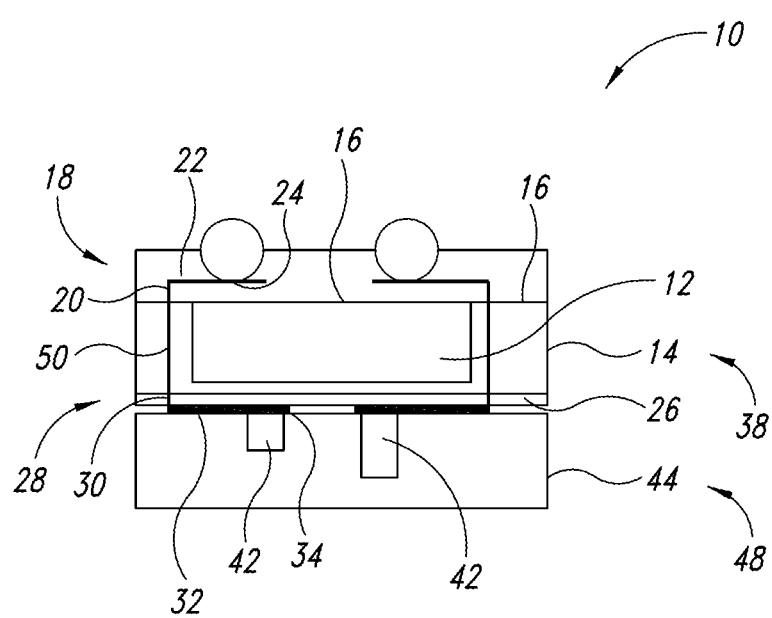
FIG. 1 is a schematic side view of a system-in-package according to an embodiment of the present disclosure.

FIG. 1 is a schematic side view of a system-in-package 10 according to an embodiment of the present disclosure. Generally described, the system-in-package 10 includes a first electrical device 12 encapsulated on side and rear surfaces in a first molding compound 14. The first electrical device 12 may be any electronic device including, including but not limited to, a micro-electromechanical device (MEMS) or integrated circuit and may be formed in a semiconductor material, such as silicon. A top surface 16 of the first electrical device 12 and of the first molding compound 14 is a first redistribution layer 18. In the illustrated embodiment, the first redistribution layer 18 is a fan-out redistribution layer. As is known in the art, the first redistribution layer 18 includes conductive vias 20, traces 22, and contact pads 24. On a back surface 26 of the first molding compound 14 is a second redistribution layer 28 having conductive vias 30, surface traces 32, and contact pads 34. The first electrical device 12, first molding compound 14, and first and second redistribution layers 18, 28 form a first chip 38.

The system-in-package 10 further includes one or more electrical components 42 encapsulated in a second molding compound 44 that are located proximate the second redistribution layer 28 of the first chip 38. The one or more electrical components 42 and the second molding compound 44 form a second chip 48. The one or more electrical components 42 may include active electrical devices, passive components, antennas, and the like.

Conductive through vias 50 are provided in the first molding compound 14 of the first chip 38. The conductive through vias 50 are electrically coupled at one end to conductive vias 20, traces 22, and contact pads 24 in the first redistribution layer 18 and at the other end to conductive vias 30, traces 32, and contact pads 34 of the second redistribution layer 28 on the back surface 26 of the first molding compound 14. The electrical components 42 of the second chip 48 are coupled to a respective one of the contact pads 34 of the second redistribution layer 28 of the first chip 38 to allow electrical communication there between. In that regard, a contact pad in the first redistribution layer 18 may be in electrical communication with an electrical component 42 of the second chip 48.

Figure 2A:
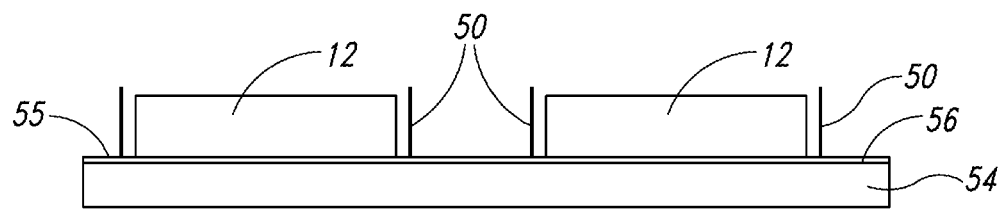
FIGS. 2A-2F are partial schematic side views of various stages for forming a first wafer according to an embodiment of the present disclosure.

FIGS. 2A-2F are partial schematic side views of various stages for forming a first wafer 52, a portion of which may be used for the first chip 38 in the system-in-package 10 of FIG. 1. As shown in FIG. 2A, a carrier substrate 54 having an adhesive material 55 on a first surface 56 thereof is provided. A plurality of electrical devices, such as semiconductor dice 12, are placed, such as by a pick and place operation, onto the first surface 56 of the carrier substrate 54 in spaced apart relationship to one another.

The semiconductor dice 12 are placed onto the carrier substrate 54 with its active surface facing the first surface 56 of the carrier substrate 54. Between the semiconductor dice 12 are one or more conductive elements or through conductive vias 50. In one embodiment, the conductive elements 50 are copper bars. In some embodiments, the conductive elements 50 may include nonconductive material, such as a nonconductive structure that surrounds a conductive core.

The semiconductor dice 12 and conductive elements 50 are held in place on the carrier substrate 54 by the adhesive material 55. It is to be appreciated that the adhesive material may alternatively be located on bottom surfaces of the semiconductor dice 12 and on the conductive elements 50 prior the dice being placed onto the carrier substrate 54.

Figure 2B:
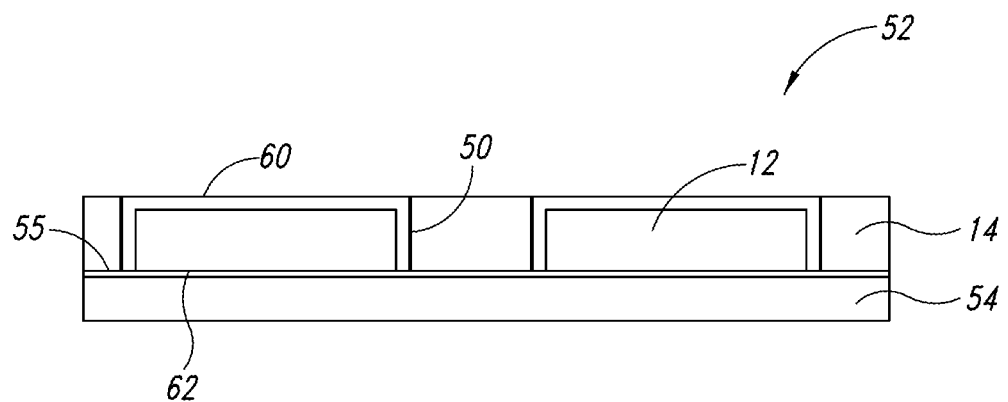

As shown in FIG. 2B, a first molding compound 14 is dispensed around the semiconductor dice 12 and the conductive elements 50 and may be cured by heat and compression to form the first wafer 52. The conductive elements 50 form conductive through vias that extend through the first molding compound 14. The first wafer 52 includes a back surface 60 and a front surface 62, with the front surface 62 being located proximate the carrier substrate 54. It is be understood that the active surface of the semiconductor dice 12 form a portion of the plane defined by the front surface 62 of the first wafer 52. In some embodiments, the first molding compound 14 on the back surface 60 of the first wafer may have a portion removed to expose an end of the conductive element 50 and/or expose a back surface of the semiconductor dice.

Figure 2C:
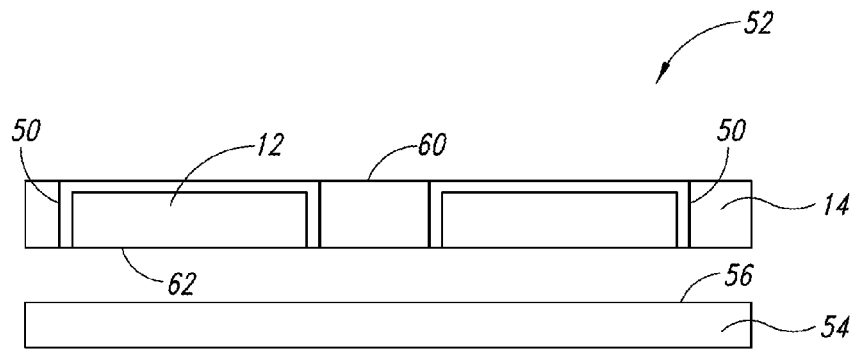

As shown in FIG. 2C, the first wafer 52 may be separated from the carrier substrate 54 prior to subsequent processing of the first wafer 52. This may be accomplished by reducing the adhesive strength of the adhesive between the semiconductor dice 12 and conductive elements 50, such as by exposing the adhesive to UV light and/or heat.

Figure 2D:
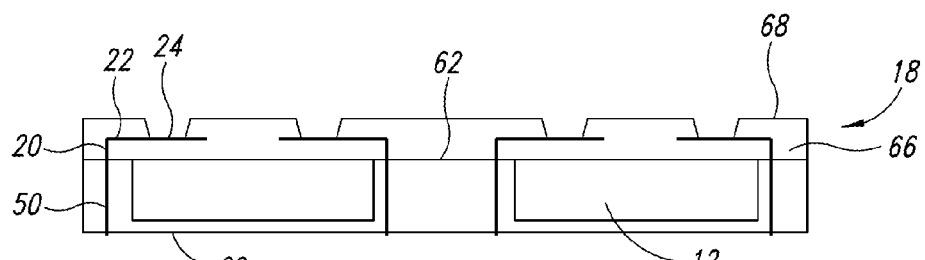

A first redistribution layer 18 is formed on the front surface 62 of the first wafer 52 as is shown in FIG. 2D. In the illustrated embodiment, the first redistribution layer 18 is a fan-out redistribution layer and is formed using known methods. Generally described, the first redistribution layer 18 includes a first dielectric layer 66 in which openings are formed exposing a top surface of the conductive elements 50. A conductive material, such as copper, is deposited in the openings and on portions of the surface of the first dielectric layer 66 to form conductive vias 20, traces 22, and contact pads 24. In that regard, the contact pads 24 are in electrical communication with the conductive elements 50. A second dielectric layer 68 is formed over the first dielectric layer 68 and the traces 22. The second dielectric layer 66 has openings located over the contact pads 24.

Figure 2E:
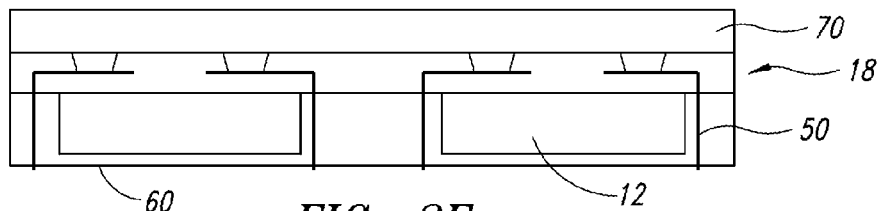

As shown in FIG. 2E, a protective material 70 is provided over the first redistribution layer 18. The protective material 70 may be any material configured to protect the first redistribution layer 18 while the back surface 60 of the first wafer 52 is processed. For instance, the protective material 70 may protect the first redistribution layer 18 from contamination or chemical reactions during subsequent processing steps. Non-limiting examples of the protective material 70 include tape and a substrate, such as a silicon or glass substrate.

Figure 2F:
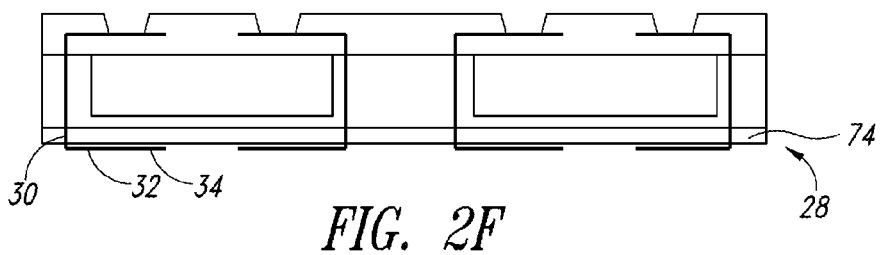

As shown in FIG. 2F, a second redistribution layer 28 is formed on the back surface 60 of the first wafer 52. The second redistribution layer 28 is formed using known methods. Generally described, the second redistribution layer 28 includes a dielectric layer 74 formed on the back surface 60 of the first wafer 52. The dielectric layer 74 has openings exposing a surface of the conductive elements 50. As in forming the first redistribution layer 18, a conductive material is deposited in the openings to form vias 30 and on portions of the surface of the dielectric material 74 to form surface traces 32 and contact pads 34. The surface traces 32 and contact pads 34 are in electrical communication with the conductive elements 50. In one embodiment, the surface traces 32 and contact pads 34 are copper wires that extend along the surface of the dielectric material 74. The protective material 70 may be removed from the first redistribution layer 18.

Figure 3A:
FIGS. 3A-3C are partial schematic side views of various stages for forming a second wafer according to an embodiment of the present disclosure.
Figure 3B:
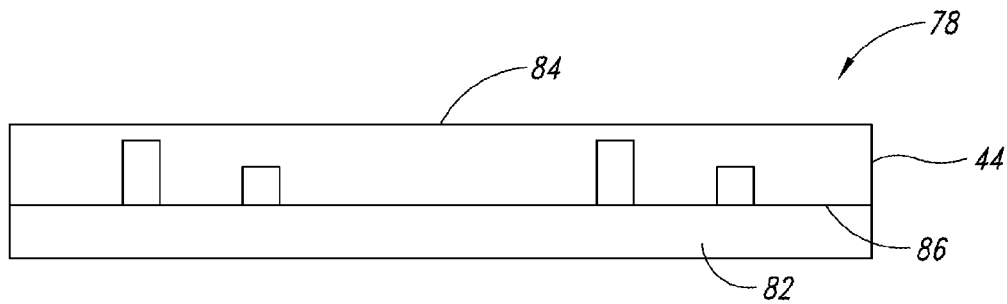
Figure 3C:
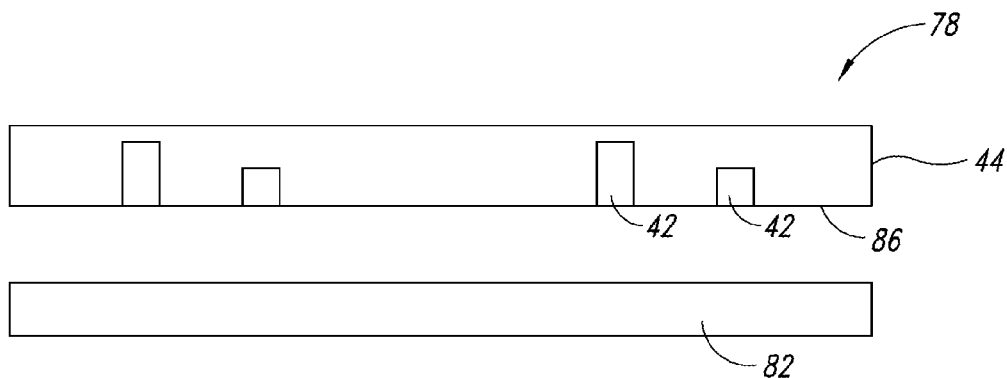

FIGS. 3A-3C are partial schematic side views of various stages for forming a second wafer 78, a portion of which may be used for the second chip 48 in the system-in-package 10 of FIG. 1. As shown in FIG. 3A, a plurality of electrical components 42 are placed, such as by a pick and place operation, on a first surface of a substrate carrier 82 with an active surface of the electrical component 42 facing the first surface of the substrate carrier 82. The electrical components 42 may be held in place be an adhesive either placed on the first surface of the substrate carrier 42 or on the active surface of the electrical components 42. The electrical components 42 may be active or passive, such as capacitors, resistors, and the like.

As shown in FIG. 3B, a second molding compound 44 is dispensed around the electrical components 42 and may be cured by heat and compression to form the second wafer 78. The second wafer 78 includes a back surface 84 and a front surface 86 that is located proximate the carrier substrate 82. It is be understood that the active surface of the electrical components 42 form a portion of the plane defined by the front surface 86 of the second wafer 78. As shown in FIG. 3C, the second wafer 78 may be separated from the carrier substrate 82 using known methods, such as those described above in reference to the first wafer 52.

Figure 4:
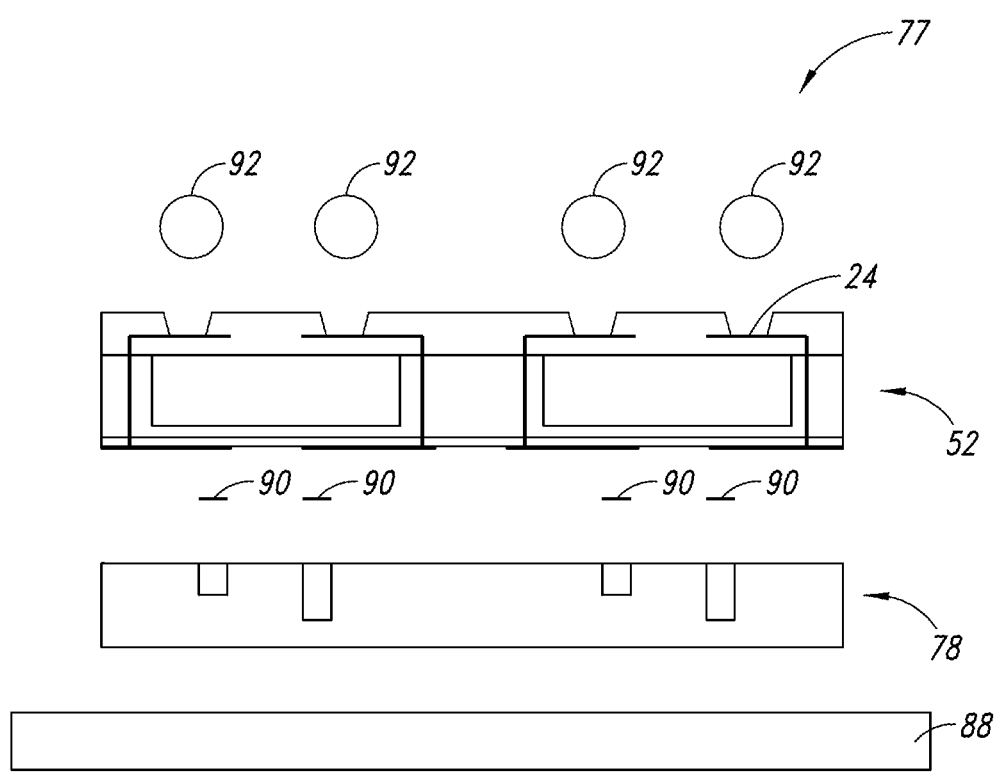
FIG. 4 is a partial schematic exploded side view of a wafer-level system-in-package according to an embodiment of the present disclosure.
Figure 5:
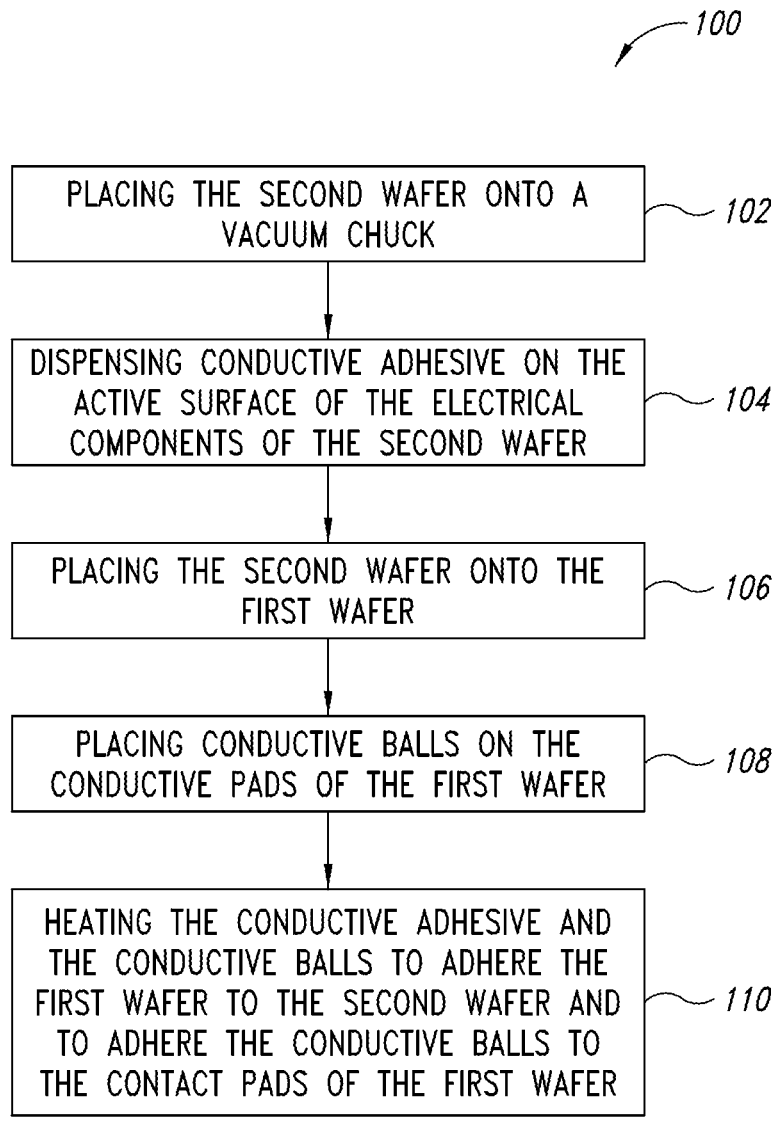
FIG. 5 is a flow chart illustrating some of the steps for forming the system-in-package shown in FIG. 1.

FIG. 4 a partial schematic exploded side view of a wafer-level system-in-package 77. FIG. 5 is a flow diagram illustrating a method 100 of forming the wafer-level system-in-package 77. Referring to both FIGS. 4 and 5, the second wafer 78 may be provided on a vacuum chuck 88 with its back surface 60 facing the vacuum to hold the second wafer 78 in place as indicated by step 102 in FIG. 5. Conductive adhesive 90, such as a solder paste, is provided, such as dispensed, on the active surface of the electrical components 42 of the second wafer 78 as indicated by step 104. The first wafer 52 is placed on to the second wafer 78 such that the active surface of the electrical components 42 of the second wafer 78, the conductive adhesive 90, and the contact pads 34 of the second redistribution layer 28 on the back surface 60 of the first wafer 52 are aligned for forming the wafer-level system-in-package 77. Conductive balls 92, such as solder balls, are formed on the conductive pads 24 of the first wafer 52 as indicated by step 108. It is to be appreciated that the conductive balls 92 may be any shape so long as they are configured to provide electrical communication between the conductive pads of the first wafer 52 and another device, such as contact pads of a circuit board. In an alternative embodiment, the conductive balls 92 are attached to the conductive pads 24 of the first wafer 52 before the first wafer 52 is placed on the conductive adhesive 90 on the second wafer 78.

The wafer-level system-in-package 77 is then heated causing the conductive adhesive 90 and conductive balls 92 to reflow thereby adhering the first wafer 52 to the second wafer 78 and the conductive balls 92 to the contact pads 24 of the first wafer 52 as indicated by step 110. Heating the conductive adhesive 90 and the conductive balls 92 may be completed by various heating methods, including conduction, convection, and infrared heat. For instance, the wafer-level system-in-package 77 may be placed in an oven or the conductive adhesive 90 and conductive balls 92 may be exposed to radiation, via heat lamps.

It is to be appreciated that some of the conductive balls 92 are in electrical communication with the semiconductor device 12 of the first wafer 52 via the traces 22 and vias 20 in the first redistribution layer 18 and some of the conductive balls 92 are in electrical communication with the electrical components 42 of the second wafer 78 via conductive elements 50, vias 30, traces 32, and contact pads 34.

Repeated cycling of system-in-packages between high and low temperatures can affect the reliability of the system-in-package. That is, heating the system-in-package to adhere conductive elements at various stages can affect the reliability of the system-in-package. Thus, by heating the wafer-level system-in-package one time to adhere both the first wafer to the second wafer via the conductive adhesive and the conductive balls to the conductive pads of the first wafer, the system-in-package experiences fewer high/low temperature cycles.

Figure 6:
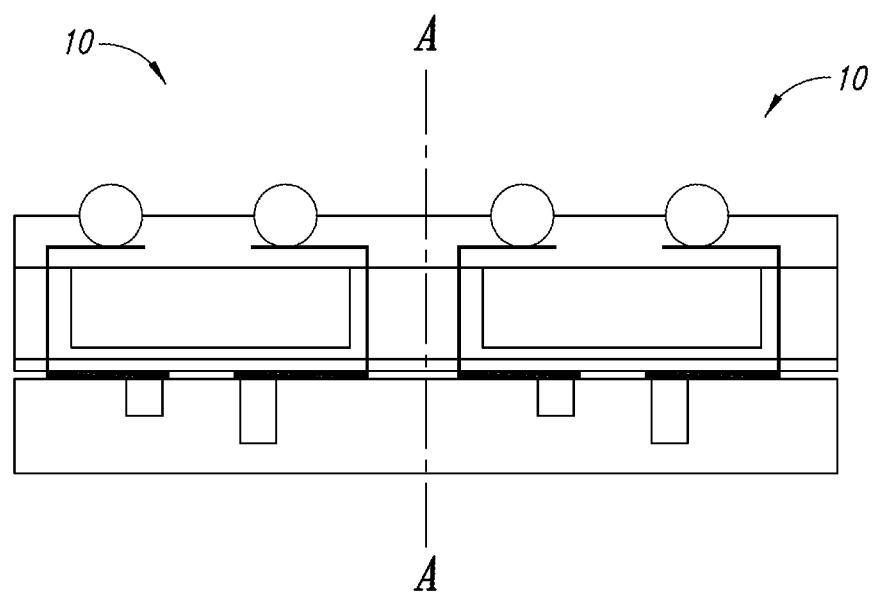
FIG. 6 is a partial schematic illustration for showing a dicing step of the wafer-level system-in-package to form individual system-in-packages as shown in FIG. 1.

FIG. 6 shows the wafer-level system-in-package 77 diced, such as by saw, laser, or other methods, along line A-A separating the wafer-level system-in-package 77 to individual packages 10, such as is shown in FIG. 1.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
    placing a conductive adhesive on at least one of a first wafer and a second wafer, the first wafer having first and second surfaces and semiconductor devices, the first wafer including bond pads located on the first surface and coupled to respective semiconductor devices, the second wafer having an electrical component;
    forming conductive balls on the bond pads on the first surface of the first wafer; and
    causing the conductive balls to adhere to the bond pad and the conductive adhesive to adhere the first wafer to the second wafer by heating the conductive balls and the conductive adhesive, wherein the heating that causes the conductive balls to adhere to the bond pad is performed concurrently with the heating that causes the conductive adhesive to adhere the first wafer to the second wafer.

2. The method of claim 1 wherein placing the conductive adhesive comprises dispensing the conductive paste on at least one of the first and second wafer, and wherein placing conductive balls comprises dispensing the conductive paste on the bond pads on the first surface of the first wafer.

3. The method of claim 1 wherein the conductive balls and the conductive adhesive include solder material.

4. The method of claim 3 wherein causing the conductive balls to adhere to the bond pad and the conductive adhesive to adhere the first wafer to the second wafer comprises reflowing the conductive balls and the conductive adhesive.

5. The method of claim 1 wherein placing the conductive adhesive on at least one of the first wafer and the second wafer comprises dispensing the conductive adhesive on a surface of the electrical component of the second wafer.

6. The method of claim 1 wherein the electrical component is a passive component.

7. The method of claim 1 wherein providing the second wafer has a plurality of electrical components.

8. The method of claim 1 wherein the first wafer is a fan out wafer and includes conductive through vias that electrically couple the bond pads on the first surface to conductive material located on the second surface of the first wafer.

9. The method of claim 1 wherein placing a conductive adhesive on at least one of the first wafer and the second wafer is completed before placing conductive balls on the bond pads on the first surface of the first wafer.

10. A method comprising:
    forming a first wafer having an upper surface and a lower surface, the forming including encapsulating a semiconductor device and a conductive through element, the first wafer having first conductive pads on the upper surface and second conductive pads on the lower surface, one of the first conductive pads being coupled to one of the second conductive pads via the conductive through element;
    forming a second wafer having an upper surface, the forming including encapsulating an electrical component, the second wafer having a third conductive pad on the upper surface;
    placing a conductive adhesive on the third conductive pad of the second wafer;
    placing the first wafer on the second wafer with the conductive adhesive aligned with the second conductive pad of the first wafer;
    forming conductive balls on the first conductive pads of the first wafer; and
    adhering the first wafer to the second wafer, adhering the first wafer to the second wafer includes heating the conductive adhesive; and
    adhering the conductive balls to the first conductive pads, respectively, by heating the conductive balls, wherein the heating that adheres the first wafer to the second wafer and the heating that adheres the conductive balls to the first conductive pads is performed concurrently.

11. The method of claim 10, further comprising forming a first redistribution layer on the first wafer and thereby forming the upper surface of the first wafer.

12. The method of claim 11, further comprising forming a second redistribution layer on the lower surface of the first wafer, the second redistribution layer including the second conductive pads that are coupled to the conductive through element of the of the first wafer.

13. The method of claim 10 wherein the conductive adhesive and the conductive balls include solder.

14. The method of claim 13 wherein adhering the first wafer to the second wafer and adhering the conductive balls to the first conductive pads comprises reflowing the conductive adhesive and the conductive balls.

15. The method of claim 13 wherein placing the conductive adhesive on the third conductive pad of the second wafer comprises dispensing the conductive adhesive.

16. A method comprising:
    forming a first wafer that includes a plurality of semiconductor devices and a plurality of conductive elements in a first encapsulated material, the first wafer having a first surface and a second surface, the semiconductor device having a front face forming a portion of the first surface of the first wafer;

forming a first redistribution layer on the first surface of the first wafer, the first redistribution layer having an outer surface, the first redistribution layer having first contact pads on the outer surface;

forming a second redistribution layer on the second surface of the first wafer, the second redistribution layer having an outer surface, the second redistribution layer having second contact pads on the outer surface, each of the second contact pads being in electrical communication to a respective one of the first contact pads;

forming a second wafer that includes a plurality of passive components in a second encapsulation material, the second wafer having a first surface, each passive component having a third contact pad on the first surface;

placing a conductive adhesive on at least one of the third contact pad and the second contact pad;

placing conductive material on the first contact pads; and adhering the conductive adhesive to the second contact pad and the third contact pad while concurrently adhering the conductive material to the first contact pad.

17. The method of claim 16 wherein conductive adhesive and the conductive material include solder.

18. The method of claim 16 wherein adhering the conductive adhesive to the second contact pad and the third contact pad and adhering the conductive material to the first contact pad comprises placing the first wafer and the second wafer in an oven or exposing the first wafer and second wafer to radiation.

19. The method of claim 16 wherein placing a conductive adhesive on at least one of the third contact pad and the second contact pad comprises dispensing conductive adhesive on the third contact pad.

20. The method of claim 16, further comprising singulating the first and second wafers into individual packages.

* * * * *